United States Patent
Russ et al.

(10) Patent No.: US 11,121,126 B2
(45) Date of Patent: Sep. 14, 2021

(54) SILICON CONTROLLED RECTIFIER AND MANUFACTURING METHOD THEREFOR

(71) Applicant: Infineon Technologies AG, Neubiberg (DE)

(72) Inventors: Christian Cornelius Russ, Diedorf (DE); Markus Eckinger, Regenstauf (DE); Kai Esmark, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/775,552

(22) Filed: Jan. 29, 2020

(65) Prior Publication Data
US 2020/0243507 A1     Jul. 30, 2020

(30) Foreign Application Priority Data
Jan. 30, 2019 (EP) .................................... 19154573

(51) Int. Cl.
    *H01L 27/02* (2006.01)
    *H01L 29/06* (2006.01)
    *H01L 29/74* (2006.01)

(52) U.S. Cl.
    CPC ...... *H01L 27/0262* (2013.01); *H01L 29/0696* (2013.01); *H01L 29/7436* (2013.01)

(58) Field of Classification Search
    CPC ............. H01L 27/0262; H01L 29/0696; H01L 29/7436; H01L 29/0692; H01L 29/87
See application file for complete search history.

(56) References Cited

U.S. PATENT DOCUMENTS

2009/0212323 A1    8/2009   Liu et al.
2012/0199874 A1    8/2012   Salcedo et al.
(Continued)

FOREIGN PATENT DOCUMENTS

DE      102004004862 B4     4/2010

OTHER PUBLICATIONS

Dendron, Amaury, et al., "New High Voltage ESD Protection Devices Based on Bipolar Transistors for Automotive Applications", 2011 33rd Electrical Overstress/Electrostatic Discharge Symposium (EOS/ESD), 2011.

(Continued)

*Primary Examiner* — Sitaramarao S Yechuri
(74) *Attorney, Agent, or Firm* — Murphy, Bilak & Homiller, PLLC (57) ABSTRACT

An embodiment of a silicon controlled rectifier (SCR) includes a semiconductor body, an active device region, and a device isolation region configured to electrically insulate the active device region from neighboring active device regions. First SCR regions and a second SCR region of a first conductivity type are in the active device region. A first pn-junction or Schottky junction is formed at an interface between the first SCR regions and the second SCR region. A first plurality of the first SCR regions and sub-regions of the second SCR region are alternately arranged and directly adjoin one another. A second pn-junction is formed at an interface between the second SCR region and a third SCR region of a second conductivity type. A third pn-junction is formed at an interface between the third SCR region and a fourth SCR region of the first conductivity type.

19 Claims, 6 Drawing Sheets

(56) References Cited

U.S. PATENT DOCUMENTS

| | | | |
|---|---|---|---|
| 2015/0144996 A1* | 5/2015 | Domanski | H01L 29/74 257/173 |
| 2015/0162286 A1 | 6/2015 | Lin et al. | |
| 2015/0228784 A1* | 8/2015 | Nakajima | H01L 29/0834 257/329 |
| 2017/0179110 A1 | 6/2017 | Lee | |
| 2018/0122794 A1 | 5/2018 | Sun et al. | |
| 2020/0135714 A1* | 4/2020 | Mallikarjunaswamy | H01L 27/0641 |

OTHER PUBLICATIONS

Liu, Zhiwei, et al., "Segmented SCR for High Voltage ESD Protection", 2012 IEEE 11th International Conference on Solid-State and Integrated Circuit Technology, 2012.

Salcedo, Javier A., et al., "Bidirectional Devices for Automotive-Grade Electrostatic Discharge Applications", IEEE Electron Device Letters, vol. 33, No. 6, Jun. 2012.

Zhan, Carol Rouying, et al., "High-Performance Bi-directional SCR Developed on a 0.13um SOI-based Smart Power Technology for Automotive Applications", 2017 39th Electrical Overstress/Electrostatic Discharge Symposium '(EOS/ESD), 2017.

Zhan, Carol (Rouying), et al., "High-voltage Asymmetrical Bi-directional Device for System-level ESD Protection of Automotive Applications on a BiCMOS Technology", 2013 35th Electrical Overstress/Electrostatic Discharge Symposium, 2013.

* cited by examiner

Fig. 9B

# SILICON CONTROLLED RECTIFIER AND MANUFACTURING METHOD THEREFOR

TECHNICAL FIELD

The present disclosure is related to semiconductor devices, in particular to silicon controlled rectifiers, SCRs (thyristors) and manufacturing methods therefor.

BACKGROUND

Components such as transistors, diodes, resistors, electro-optical devices, precision film resistors and a variety of integrated circuits are all sensitive to ElectroStatic Discharge (ESD), and as electronics manufacturers drive to miniaturize devices and improve operating speeds, susceptibility of devices to ESD is increasing. Devices are subject to ESD damage at every stage of production: from wafer fabrication to populated circuit boards in sub-assemblies and assemblies. Also during operation of components or integrated circuits unwanted voltage pulses may arise. In automotive chips, unwanted voltage pulses may be caused by the vehicle wiring any may damage sensitive subsystems such as safety systems, control modules and infotainment equipment. Pulses can be caused by events such as electrostatic discharges (ESD) from occupants, turn-on/off of subsystems such as motor drives or climate control, or load dumps when a significant load such as the battery is suddenly disconnected. For avoiding damage to integrated circuits or electronic devices by pulses during assembly or operation, ESD protection devices, e.g. SCRs are connected between pins of an integrated circuit in order to prevent a malfunction or breakdown of circuits connected between the pins by pulses.

There is a need to improve silicon controlled rectifiers for ESD protection.

SUMMARY

An embodiment of the present disclosure relates to a silicon controlled rectifier, SCR. The silicon controlled rectifier comprises a semiconductor body including a first main surface. The silicon controlled rectifier further comprises an active device region and a device isolation region configured to electrically insulate the active device region from neighboring active device regions. The SCR further comprises first SCR regions in the active device region and a second SCR region of a first conductivity type in the active device region. A first pn-junction or a Schottky junction is formed at an interface between the first SCR regions and the second SCR region. A first plurality of the first SCR regions and sub-regions of the second SCR region are alternately arranged and directly adjoin one another. The SCR further comprises a third SCR region of a second conductivity type in the active device region. A second pn-junction is formed at an interface between the second SCR region and the third SCR region. The silicon controlled rectifier further comprises a fourth SCR region of the first conductivity type in the active device region. A third pn-junction is formed at an interface between the third SCR region and the fourth SCR region. The SCR further comprises a first electrode electrically connected to the first plurality of the first SCR regions at the first main surface and a second electrode electrically coupled to the fourth SCR region at the first main surface.

Another embodiment of the present disclosure relates to a method of manufacturing a silicon controlled rectifier, SCR. The method comprises providing a semiconductor body including a first main surface. The method further comprises forming a device isolation region configured to electrically insulate the active device region from neighboring active device regions. The method further comprises forming first SCR regions in the active device region. The method further comprises forming a second SCR region of a first conductivity type in the active device region, wherein a first pn-junction or a Schottky junction is formed at an interface between the first SCR regions and the second SCR region, and a first plurality of the first SCR regions and sub-regions of the second SCR region are alternately arranged and directly adjoin one another. The method further comprises forming a third SCR region of a second conductivity type in the active device region, wherein a second pn-junction is formed at an interface between the second SCR region and the third SCR region. The method further comprises forming a fourth SCR region of the first conductivity type in the active device region, wherein a third pn-junction is formed at an interface between the third SCR region and the fourth SCR region. The method further comprises forming a first electrode electrically connected to the first plurality of the first SCR regions at the first main surface, and forming a second electrode electrically coupled to the fourth SCR region at the first main surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments of the semiconductor device and the method of manufacturing a semiconductor device, and together with the description serve to explain principles of the embodiments. Further embodiments and intended advantages will be readily appreciated as they become better understood by reference to the following detailed description. Further embodiments are described in the following detailed description and the claims.

DETAILED DESCRIPTION

In the following detailed description, reference is made to the accompanying drawings, which form a part thereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as $a \leq y \leq b$. A parameter y with a value of at least c reads as $c \leq y$ and a parameter y with a value of at most d reads as $y \leq d$.

According to an embodiment of a silicon controlled rectifier, the silicon controlled rectifier may comprise a semiconductor body including a first main surface. The silicon controlled rectifier may further comprise an active device region and a device isolation region configured to electrically insulate the active device region from neighboring active device regions. The silicon controlled rectifier may further comprise first SCR regions in the active device region and a second SCR region of a first conductivity type in the active device region. A first pn-junction or a Schottky junction may be formed at an interface between the first SCR regions and the second SCR region. A first plurality of the first SCR regions and sub-regions of the second SCR region may be alternately arranged and may directly adjoin one another. The silicon controlled rectifier may further comprise a third SCR region of a second conductivity type in the active device region. A second pn-junction may be formed at an interface between the second SCR region and the third SCR region. The silicon controlled rectifier may further comprise a fourth SCR region of the first conductivity type in the active device region. A third pn-junction may be formed at an interface between the third SCR region and the fourth SCR region. A first electrode may be electrically connected to the first plurality of the first regions at the first main surface and a second electrode may be electrically coupled to the fourth SCR region at the first main surface.

The silicon controlled rectifier may be an ESD protection device. The silicon controlled rectifier may be formed by a CMOS (Complementary Metal Oxide Semiconductor) technology or by a family of processes, each of which combines the strengths of different process technologies onto a single chip: Bipolar for precise analog functions, CMOS (Complementary Metal Oxide Semiconductor) for digital design and DMOS (Double Diffused Metal Oxide Semiconductor) for power and high-voltage elements. These mixed processes are also known as BCD (Bipolar CMOS DMOS) technology or Smart Power Technology (SPT).

The silicon controlled rectifier may be a bi-directional (also called dual direction) silicon controlled rectifier complying with positive and negative operating voltages at the same pin. The silicon controlled rectifier may also be a uni-directional (or single direction) silicon controlled rectifier complying with either positive or negative operating voltages at the same pin.

The semiconductor body 100 may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For The active device region may be a part of the semiconductor body where all semiconductor regions of the silicon controlled rectifier, i.e. the first to fourth SCR regions are included. The active device region may be electrically connected by a corresponding part of the semiconductor body at the first main surface, for example.

The device isolation region may surround, e.g. completely surround the active device region, thereby electrically insulating the active device region from neighboring active device regions. The active isolation region may be a trench isolation, e.g. a deep trench isolation (DTI), or a pn-junction isolation, for example.

When the silicon controlled rectifier is turned on, current may be injected by a pn-junction. In this case, the first SCR regions may be formed as doped semiconductor regions of the second conductivity type and the first pn-junction is disposed at an interface between the first and second SCR regions. The SCR current may also be injected by a Schottky junction. In this case, the first SCR regions may be a metal and the Schottky junction is disposed at an interface between the first and second SCR regions.

A first plurality of the first SCR regions and sub-regions of the second SCR region may be alternately arranged and directly adjoin one another. This arrangement allows for a compact design by avoiding isolation regions, e.g. shallow trench isolations (STI) between the first and second SCR regions. Thereby, the robustness of a protection structure per unit of active area may be increased. Moreover, an effective surface of current injecting pn-junctions may be increased compared with a design having isolation regions, e.g. shallow trench isolations (STI) between the first and second SCR regions. This is because pn-junction sidewalls may be utilized for current conduction. The SCRs described herein may allow for benefits such as stronger conduction and avoidance of idling parts in the SCR, for example.

According to an embodiment of the silicon controlled rectifier, the first plurality of the first SCR regions and the sub-regions of the second SCR region are arranged in stripes extending along a lateral direction, wherein the lateral direction is parallel or perpendicular to a longitudinal direction of the second SCR region. In the first case, i.e. the lateral direction is parallel to the longitudinal direction of the second SCR region, the stripes may be perpendicular to a current flow direction of the SCR. In the second case, i.e. the lateral direction is parallel to the longitudinal direction of the second SCR region, the stripes may be parallel to a current flow direction of the silicon controlled rectifier.

According to an embodiment of the silicon controlled rectifier, the first plurality of the first SCR regions and the sub-regions of the second SCR region may be arranged in a checkerboard pattern at the first main surface.

According to an embodiment of the silicon controlled rectifier, the first plurality of the first SCR regions and a second plurality of the first SCR regions may be merged to a continuous first SCR region, and the sub-regions of the second SCR region may be laterally surrounded by the continuous first SCR region. Thus, in a plan view of the first main surface, the sub-regions of the second SCR region may be arranged as separate islands surrounded by the continuous first SCR regions. By varying a surface area ratio between the sub-regions of the second SCR region and the continuous first SCR region, SCR device parameters, e.g. SCR triggering behavior, holding voltage, trigger current, uniformity of SCR turn-on or current injection efficiency may be adjusted.

According to an embodiment of the silicon controlled rectifier, the sub-regions of the second SCR region may be defined by a first vertical doping profile that may fully overlap with a second vertical doping profile of the second SCR region, and a maximum doping concentration of the first vertical doping profile may be at least two orders of magnitude larger than a maximum doping concentration of the second vertical doping profile. The first vertical doping profile may allow for improving ohmic contact properties between the second SCR region and an electrode at the first main surface, for example. In some embodiments, the second vertical doping profile of the second SCR region may be a semiconductor well region adjoining the first main surface, and the first SCR regions may be embedded in the second SCR region. When embedding the first SCR regions in the semiconductor well region, side surfaces and a bottom of the first SCR regions may directly adjoin the second SCR region, for example. SCR current may flow through the side surfaces and the bottom of the second SCR region, for example.

According to an embodiment of the silicon controlled rectifier, the second SCR region may be defined by a single vertical doping profile, and the sub-regions of the second SCR region may be defined by a part of the single vertical doping profile. This may allow for a good and fast emitter activity under forward bias of the SCR because pinning of an electric potential of the second SCR region to the first SCR regions may be hindered.

According to an embodiment of the silicon controlled rectifier, an overall area of the second SCR region at the first main surface may directly adjoin a dielectric. In other words, the second SCR region may not be directly electrically connected at the first main surface of the second SCR region. As an example, the pn-junction between the second SCR region and the first SCR regions close to the first main surface may be a degenerate pn-junction allowing for current flow without any pronounced blocking characteristic. Thus, the second SCR region may be electrically connected to an electrode at the first main surface via the first SCR regions. Assuming that the first conductivity type is a p-type and the second conductivity type is an n-type, an electron current in forward bias of the pn-junction may spread over sidewalls and a bottom of the first SCR regions. Thus, an overall area of the pn-junction may be utilized for current conduction and lateral current confinement may be avoided, for example.

According to an embodiment of the silicon controlled rectifier, an overall area of the second SCR region at the first main surface may directly adjoin a metal silicide. A contact area of the first electrode may be limited to an area of the first plurality of the first SCR regions at the first main surface. Thus, the second SCR region may have a slightly higher ohmic resistance to the first electrode compared with an embodiment where the first electrode directly contacts the second SCR region at the first main surface. This may allow for an improved forward biasing of the pn-junction, for example.

According to an embodiment of the silicon controlled rectifier, a lateral doping concentration profile of the second conductivity type that extends, at a constant vertical level in the semiconductor body, through one of the first SCR regions and through a neighboring one of the sub-regions of the second SCR region, is a constant lateral doping concentration profile. According to another embodiment of the silicon controlled rectifier, a lateral doping concentration profile of the first conductivity type that extends, at a constant vertical level in the semiconductor body, through one of the first SCR regions and through a neighboring one of the sub-regions of the second SCR region, is a constant lateral doping concentration profile. Thus, when forming the first and second SCR regions, dopants for forming one region out of the first and second SCR regions may also be introduced into the other region out of the first and second SCR regions. The dopants for forming the other region out of the first and second SCR regions may then or beforehand be introduced via a masked ion implantation and/or diffusion process that hinders the dopants from entering the one region out of the first and second SCR regions. Thus, the dopants for forming the other region out of the first and second SCR regions are partially compensated by dopants for forming the one region out of the first and second SCR regions.

According to an embodiment of the silicon controlled rectifier, the second SCR region and the fourth SCR region may be embedded in the third SCR region. The silicon controlled rectifier may further comprise fifth SCR regions in the active device region, wherein a fourth pn-junction or a Schottky junction may be formed at an interface between the fourth SCR region and the fifth SCR region. A first plurality of the fifth SCR regions and sub-regions of the fourth SCR region may be alternately arranged and directly adjoin one another. The second electrode may be electrically connected to the first plurality of the fifth SCR regions at the first main surface. Dimensions of the fifth SCR regions may correspond with dimensions of the first SCR regions, for example. Dimensions of the sub-regions of the second SCR region may correspond with dimensions of the sub-regions of the fourth SCR region, for example. The first SCR regions and the second SCR region may be electrically coupled to the first electrode and the fifth SCR regions and the fourth SCR region may be electrically coupled to the second electrode, thereby forming a bi-directional silicon controlled rectifier.

According to an embodiment of the silicon controlled rectifier, the second SCR region may be embedded in the third SCR region. A first plurality of fourth SCR regions and sub-regions of the third SCR region may be alternately arranged and directly adjoin one another. The silicon controlled rectifier may be a uni-directional silicon controlled rectifier, for example a uni-directional silicon controlled rectifier in High-Voltage (HV) CMOS technology employing a highly doped buried layer arranged between a semiconductor substrate and the first to fifth SCR regions.

According to an embodiment of the silicon controlled rectifier, the third SCR region may be spaced apart from the first main surface and the fourth SCR region may be arranged between the first main surface and the third SCR region. The silicon controlled rectifier may be a uni-directional silicon controlled rectifier, for example a uni-directional silicon controlled rectifier in standard CMOS technology employing the second and third SCR regions as semiconductor wells in a semiconductor substrate.

According to an embodiment of a method of manufacturing a silicon controlled rectifier, the method may comprise providing a semiconductor body including a first main surface. A device isolation region may be formed, wherein the device isolation region may be configured to electrically insulate an active device region from neighboring active device regions. First SCR regions may be formed in the active device region. A second SCR region of a first conductivity type may be formed in the active device region. A first pn-junction or a Schottky junction may be formed at an interface between the first SCR region and the second SCR region. A first plurality of the first SCR regions and sub-regions of the second SCR region may be alternately arranged and directly adjoin one another. A third SCR region of a second conductivity type may be formed in the active device region. A second pn-junction may be formed at an interface between the second SCR region and the third SCR region. A fourth SCR region of the first conductivity type may be formed in the active device region. A third pn-junction may be formed at an interface between the third SCR region and the fourth SCR region. A first electrode may be formed, wherein the first electrode may be electrically connected to the plurality of the first regions at the first main surface. A second electrode may be formed, wherein the second electrode may be electrically coupled to the fourth SCR region at the first main surface.

According to an embodiment of a method of manufacturing the silicon controlled rectifier, forming the first SCR regions may comprise at least one ion implantation process at a tilt angle in a range from 5° to 25°. The tilt angle refers to a normal of the first main surface. Tilted ion implantation may allow for an increase of a pn-junction area between the first and second SCR regions. Larger charge carrier injection may result.

According to an embodiment of a method of manufacturing the silicon controlled rectifier, forming the first SCR regions may comprise at least one ion implantation process through an opening of an ion implantation mask, wherein sidewalls of the opening are sloped or curved. The sloped sidewalls of the opening of the ion implantation mask may lead to scattering of implanted ions. This may allow for an increase of a pn-junction area between the first and second SCR regions. Larger charge carrier injection may result.

The above method may be applied for manufacturing the semiconductor device as described with respect to any of the above embodiments or any of the embodiments described below in connection with the figures.

It will be appreciated that while the method is described above and below as a series of steps or events, the described ordering of such steps or events are not to be interpreted in a limiting sense. Rather, some steps may occur in different orders and/or concurrently with other steps or events apart from those described above and below. For example, the device isolation regions may be formed before or after one, some or all of the SCR regions are formed.

The embodiments described above may be combined in any way and will be further illustrated with respect to exemplary figures described below. Conductivity types illustrated in the figures, e.g. n-doped and p-doped, may also be inverted with respect to the illustrated conductivity types.

Functional and structural details described with respect to the embodiments above shall likewise apply to the exemplary figures below.

Figure 1:
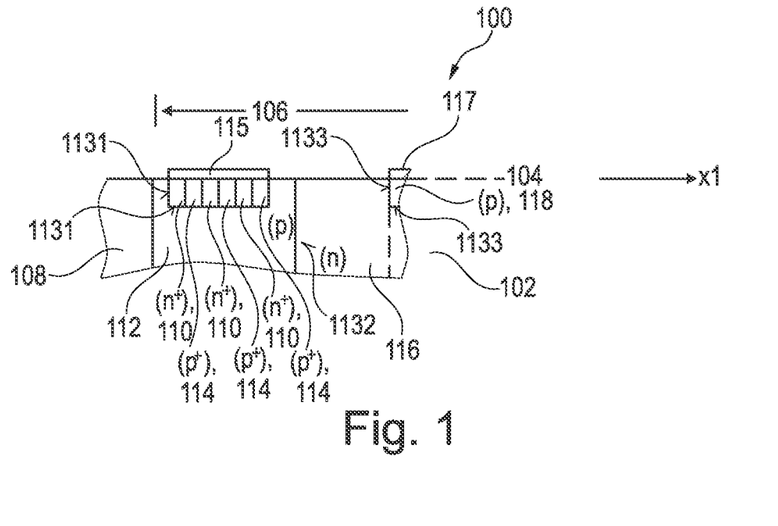
FIG. 1 illustrates a schematic cross-sectional view of an embodiment of a silicon controlled rectifier.

Referring to the schematic cross-sectional view of FIG. 1, an embodiment of a silicon controlled rectifier 100 is illustrated.

The silicon controlled rectifier 100 comprises a semiconductor body 102 including a first main surface 104. The silicon controlled rectifier 100 further comprises an active device region 106 and a device isolation region 108 configured to electrically insulate the active device region 106 from neighboring active device regions.

The silicon controlled rectifier 100 further comprises n-doped first SCR regions 110 in the active device region 106 and a p-doped second SCR region 112 in the active device region 106. A first pn-junction 1131 is formed at an interface between the first SCR regions 110 and the second SCR region 112. A first plurality of the n-doped first SCR regions 110 and sub-regions 114 of the p-doped second SCR region 112 are alternately arranged along a first lateral direction x1 and directly adjoin one another.

The silicon controlled rectifier 100 further comprises an n-doped third SCR region 116 in the active device region 106. A second pn-junction 1132 is formed at an interface between the second SCR region 112 and the third SCR region 116.

The silicon controlled rectifier 100 further comprises a p-doped fourth SCR region 118 in the active device region 106. A third pn-junction 1133 is formed at an interface between the third SCR region 116 and the fourth SCR region 118. The p-doped fourth SCR region 118 may also extend deeper into the semiconductor body 102 as is schematically illustrated by a dashed line.

The silicon controlled rectifier 100 further comprises a first electrode 115 electrically connected to the first plurality of the first regions 110 at the first main surface 104. In the embodiment illustrated in FIG. 1, the first electrode 115 also directly contacts the sub-regions 114 of the second SCR region 112 at the first main surface 104. According to other embodiments, a contact area of the first electrode 115 may be limited to an area of the first plurality of the first SCR regions 110 at the first main surface 104, and the sub-regions 114 of the second SCR region 112 may directly adjoin a dielectric, e.g. an oxide, or a metal silicide at the first main surface 104, for example.

The silicon controlled rectifier 100 further comprises a second electrode 117 electrically connected to the fourth SCR region 118 at the first main surface 104.

In the section of the silicon controlled rectifier 100 illustrated in FIG. 1, the silicon controlled rectifier 100 is a uni-directional silicon controlled rectifier. However, the silicon controlled rectifier 100 may also be formed as a bi-directional silicon controlled rectifier 100 as will be illustrated in examples described below.

Figures 2A, 2B:
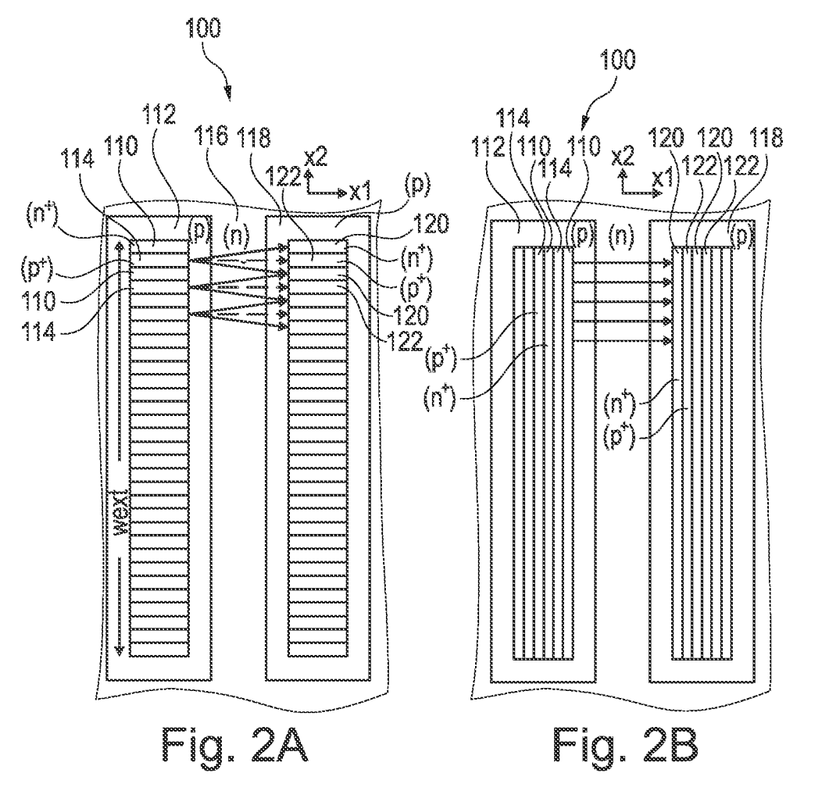
FIGS. 2A and 2B illustrate exemplary plan views of bi-directional silicon controller rectifiers.

In the schematic plan views of FIGS. 2A and 2B, embodiments of bi-directional silicon controlled rectifiers 100 are illustrated.

Referring to the schematic plan view of FIG. 2A, the p-doped second SCR region 112 is formed as a p-doped well region, and the p-doped fourth SCR region 118 is also formed as a p-doped well region. The p-doped second SCR region 112 and the p-doped fourth SCR region 118 are laterally spaced from one another and are both formed in the n-doped third SCR region 116.

A first plurality of the n-doped first SCR regions 110 and sub-regions 114 of the p-doped second SCR region 112 are arranged in stripes extending along the first lateral direction x1. The first lateral direction x1 is perpendicular to a longitudinal direction x2 of the second SCR region 112. The first plurality of the n-doped first SCR regions 110 and sub-regions 114 of the p-doped second SCR region 112 are alternately arranged along an extension wext in the longitudinal direction x2 of the second SCR region 112.

The silicon controlled rectifier 100 illustrated in FIG. 2A further comprises n-doped fifth SCR regions 120. A first plurality of the fifth SCR regions 120 and sub-regions 122 of the p-doped fourth SCR region 118 are arranged in stripes extending along the first lateral direction x1. The first plurality of the n-doped fifth SCR regions 120 and the sub-regions 122 of the p-doped fourth SCR region 118 are alternately arranged along the longitudinal direction x2 of the second SCR region 112.

In the embodiment illustrated in FIG. 2A, a current flow direction of the silicon controlled rectifier 100 is schematically indicated by arrows. The current flow direction is approximately parallel to the stripes of the fifth SCR regions 120 and to the stripes of the sub-regions 122 of the p-doped fourth SCR region 118. Also, regions 110 and 120 as well as regions 114 and 122, respectively, do not necessarily need to face each other along the lateral direction x1 but may also be shifted, e.g. such that regions 110 face regions 122 and such that regions 114 face regions 120. Other shifts are also possible, too.

Referring to the schematic plan view of FIG. 2B, the p-doped second SCR region 112 is formed as a p-doped well region, and the p-doped fourth SCR region 118 is also formed as a p-doped well region. The p-doped second SCR region 112 and the p-doped fourth SCR region 118 are laterally spaced from one another and are formed in the n-doped third SCR region 116.

A first plurality of the n-doped first SCR regions 110 and the sub-regions 114 of the p-doped second SCR region 112 are arranged in stripes extending along the longitudinal direction x2 of the second SCR region 118. The first plurality of the n-doped first SCR regions 110 and the sub-regions 114 of the p-doped second SCR region 112 are alternately arranged along the first lateral direction x1. Likewise, a first plurality of the n-doped fifth SCR regions 120 and the sub-regions 122 of the p-doped fourth SCR region 112 are arranged in stripes extending along the longitudinal direction x2 of the second SCR region 112. The first plurality of the n-doped fifth SCR regions 120 and the sub-regions 122 of the p-doped fourth SCR region 118 are alternately arranged along the first lateral direction x1.

In the embodiment illustrated in FIG. 2B, a current flow direction of the silicon controlled rectifier 100 is schematically indicated by arrows. The current flow direction is perpendicular to the stripes of the fifth SCR regions 120 and to the stripes of the sub-regions 122 of the p-doped fourth SCR region 118. FIG. 2B exemplarily depicts first stripes ("innermost" when looking from the center of the structure) of regions 110 and 120 facing other, then followed by stripes of regions 114 and 122 and then again by stripes of regions 110 and 120, and so on. This sequence may also start in the opposite manner: innermost stripes of regions 114 and 122 and so on, in order to adjust triggering behavior and holding voltage. Another possibility is an asymmetrical arrangement such that a sequence of regions 110, 114, 110, . . . is facing a sequence of regions 122, 120, 122, . . . , whereby at the "innermost" location an n-doped region 110 is facing a p-doped region 122.

In the schematic plan views of FIGS. 3A to 3D, embodiments of uni- or bi-directional silicon controlled rectifiers 100 are illustrated.

Figures 3A, 3B:
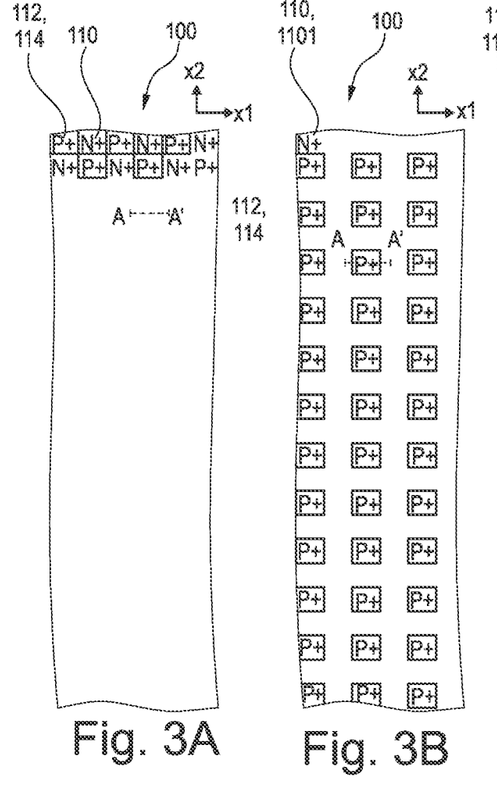
FIGS. 3A to 3D are schematic plan views for illustrating designs of first and second SCR regions.

Referring to the schematic plan view of FIG. 3A, the first plurality of the first SCR regions 110 and the sub-regions 114 of the second SCR region 112 are arranged in a checkerboard pattern at the first main surface 104.

Figures 3C, 3D:
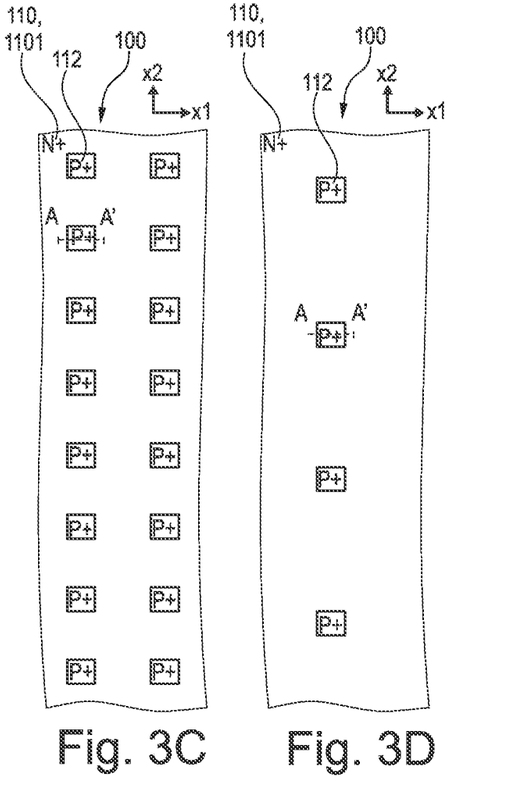

Referring to the schematic plan view of FIGS. 3B to 3D, the first plurality of the first SCR regions 110 and a second plurality of the first SCR regions 110 are merged to a continuous first SCR region 1101. The sub-regions 114 of the second SCR region 112 are laterally surrounded by the continuous first SCR region 1101. Thus, in the plan views of FIGS. 3B to 3D, the sub-regions 114 of the second SCR region 112 are arranged as separated islands surrounded by the continuous first SCR region 1101. The plan views of FIGS. 3B to 3D differ by a surface area ratio between the sub-regions 114 of the second SCR region 112 and the continuous first SCR region 1101 at the first main surface 104.

Figure 4A:
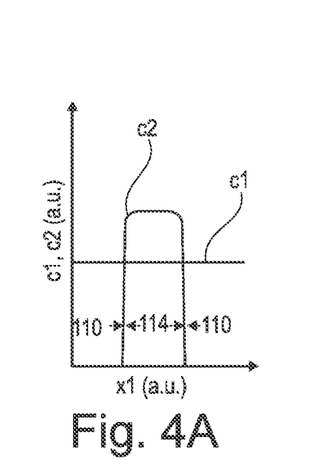
FIGS. 4A to 4C are exemplary doping concentration profiles along line A-A' of FIGS. 3A to 3D.
Figure 4B:
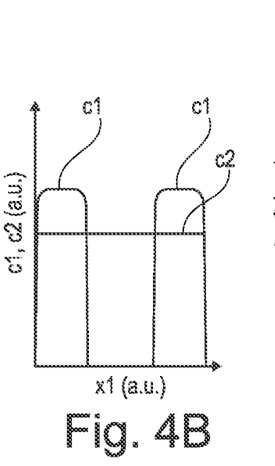
Figure 4C:
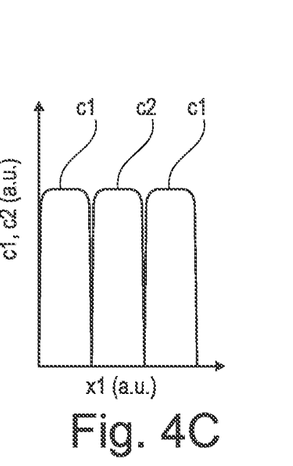

The schematic graphs of FIGS. 4A, 4B and 4C illustrate examples of profiles of lateral doping concentrations $c_1$, $c_2$ along the first lateral direction x1 of line A-A' of FIGS. 3A to 3D. The lateral doping concentrations $c_1$, $c_2$ refer to a constant vertical level in the semiconductor body. The lateral doping concentration $c_1$ is an n-type doping concentration defining the first SCR regions 110, and $c_2$ is a p-type lateral doping concentration defining the sub-regions 114 of the second SCR region 112.

In the schematic graph of FIG. 4A, the n-type doping concentration $c_1$ is constant along the first lateral direction x1. Thus, the p-type doping concentration $c_2$ in the sub-regions 114 of the second SCR region 112 is partially compensated by the n-type doping concentration $c_1$ and eventually counterdoped.

In the schematic graph of FIG. 4B, the p-type doping concentration $c_2$ is constant along the first lateral direction x1. Thus, the n-type doping concentration $c_1$ in the first SCR regions 114 is partially compensated by the p-type doping concentration $c_2$ and eventually counterdoped.

In the schematic graph of FIG. 4C, the p-type doping concentration $c_2$ along the lateral direction x1 is limited to the sub-regions 114 of the second SCR region 112. Likewise, the n-type doping concentration c2 along the lateral direction x1 is limited to the sub-regions 114 of the second SCR region 112.

The above doping profiles illustrated in FIGS. 4A to 4C may be combined in any way with respect to different areas of the silicon controlled rectifier 110 regardless of shape, e.g. stripes or islands, of the first SCR regions 110 or the sub-regions 114 of the second SCR region 112.

Figure 5A:
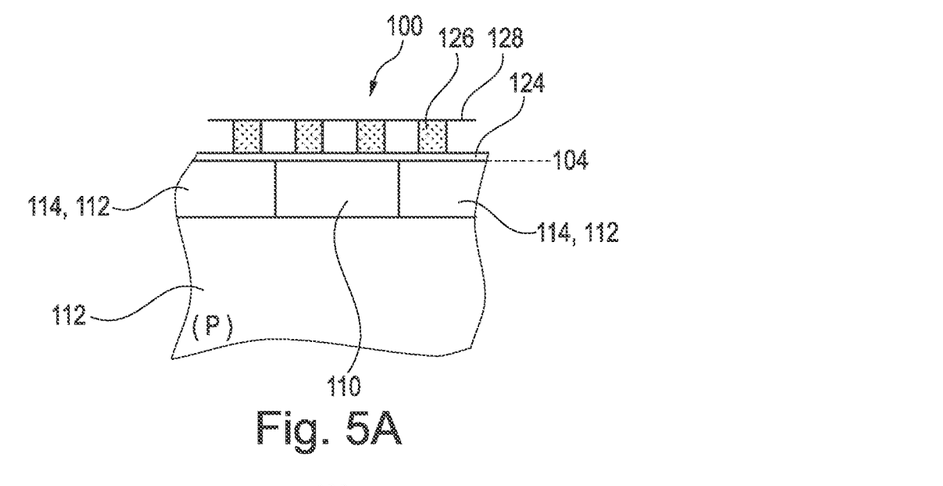
FIGS. 5A to 5D are schematic cross-sectional views for illustrating contact schemes for electrically connecting SCR regions.
Figure 5B:
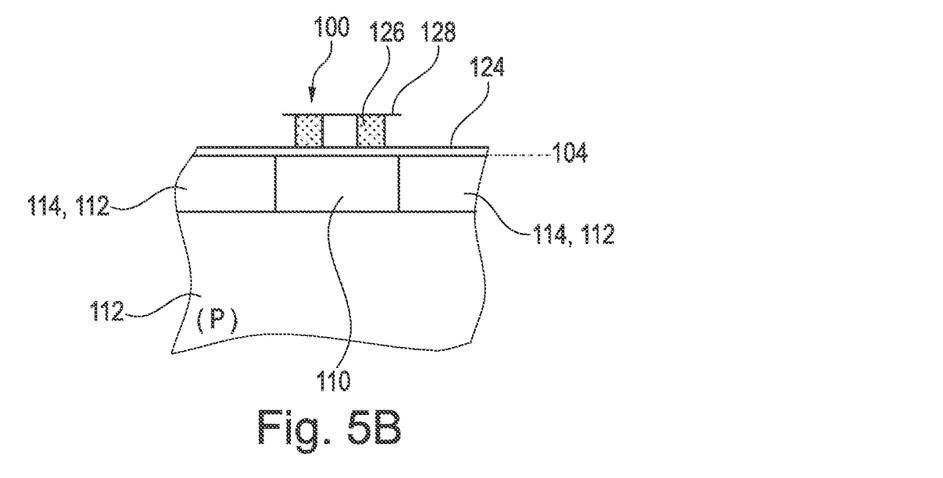
Figure 5C:
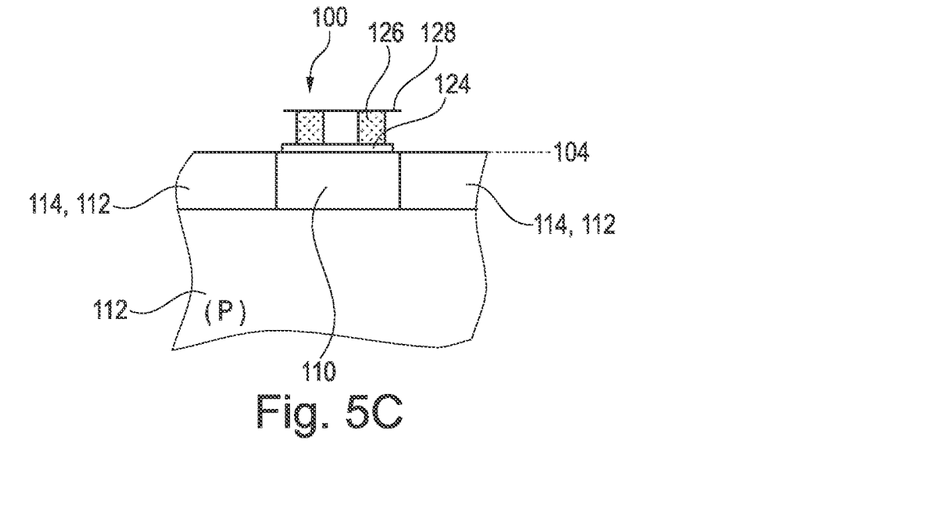

The schematic cross-sectional views of FIGS. 5A, 5B and 5C illustrate examples of an electric connection between a wiring above the semiconductor body and the first and second SCR regions 110, 112.

In the schematic cross-sectional view of FIG. 5A, a contact mediation layer 124, e.g. a metal silicide layer, directly contacts the first SCR regions 110 and the sub-regions 114 of the second SCR region 112 at the first main surface 104. Contact structures 126, e.g. contact plugs or contact lines, directly contact the contact mediation layer 124 in a surface area of the first SCR regions 110 and of the sub-regions 114 of the second SCR region 112. The contact structures 126 are electrically connected to one another by a wiring layer 128.

In the schematic cross-sectional view of FIG. 5B, the contact mediation layer 124 directly contacts the first SCR regions 110 and the sub-regions 114 of the second SCR region 112 at the first main surface 104. The contact structures 126 directly contact the contact mediation layer 124 in a surface area of the first SCR regions 110. In the embodiment illustrated in FIG. 5B, an electric connection between the sub-regions 114 of the second SCR region 112 and the contact structures 126 has a higher impedance than in the embodiment illustrated in FIG. 5A.

In the schematic cross-sectional view of FIG. 5C, the contact mediation layer 124 directly contacts the first SCR regions 110 but is omitted in a surface area of the sub-regions 114 of the second SCR region 112 at the first main surface 104. The phrase "directly contacts . . . " means that the contact mediation layer 124 covers either the entire surface of 110 or a substantially large surface portion of 110. In other words, the contact mediation layer 124 may be recessed from the position of the pn-junction between the regions 110, 114 to comply with technology requirements. The contact structures 126 directly contact the contact mediation layer 124 in the surface area of the first SCR regions 110. In the embodiment illustrated in FIG. 5C, an electric connection between the sub-regions 114 of the second SCR region 112 and the contact structures 126 has a higher impedance than in the embodiment illustrated in FIG. 5B. In case of the recessed edge of the contact mediation layer 124, the impedance may be higher than in the case illustrated in FIG. 5C.

Figure 5D:
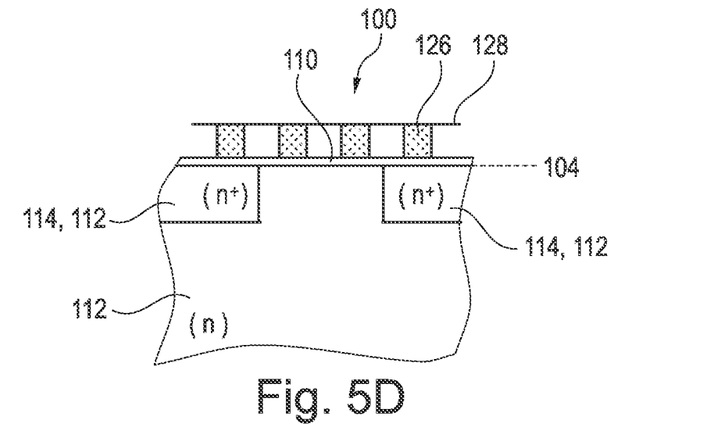

In the schematic cross-sectional view of FIG. 5D, the first SCR regions 110 comprise a contact material, e.g. a metal or a metal alloy, forming a Schottky junction with the n-doped second SCR region 112 at the first main surface 104. The contact material may form an ohmic contact to the $n^+$-doped sub-regions of the second SCR region 112 at the first main surface 104. Other contact schemes may be applied for SCRs including a Schottky junction between the first and second SCR regions. As a further example, the contact scheme illustrated in FIG. 5B may replace the contact scheme illustrated in FIG. 5D.

Figure 6:
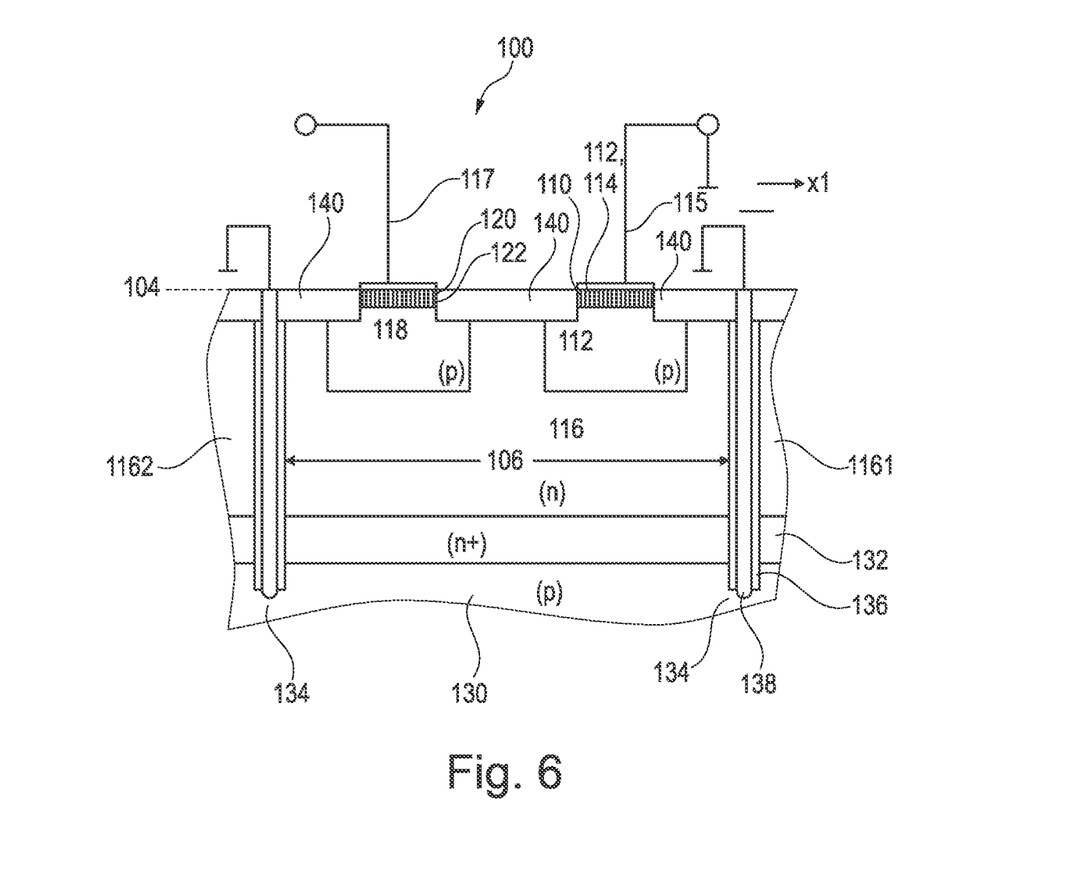
FIGS. 6 to 8 are schematic cross-sectional views for illustrating embodiments of uni- and bi-directions silicon controlled rectifiers.

The above contact schemes illustrated in FIGS. 5A to 5D as well as the doping schemes of FIGS. 4A to 4C may be combined in any way with respect to different areas of the silicon controlled rectifier 100 of FIG. 6 regardless of shape, e.g. stripes or islands, of the first SCR regions 110 or the sub-regions 114 of the second SCR region 112. By varying the effective impedance of the electric connection between the sub-regions 114 of the second SCR region 112 and the contact structures 126, electric characteristics of the silicon controlled rectifier 100, e.g. triggering behavior, triggering uniformity, holding voltage, clamping voltage, may be adjusted.

The schematic cross-sectional view of FIG. 6 illustrates an embodiment of a bi-directional silicon controlled rectifier 100.

The n-doped first SCR regions 110 and the sub-regions 114 of the p-doped second SCR region 112 are alternately arranged along the first lateral direction x1 and directly adjoin one another.

The p-doped second SCR region 112 and the p-doped fourth SCR region 118 are formed as semiconductor wells in the n-doped third SCR region 116. The third SCR region 116 may be formed by a layer deposition process on a p-doped substrate. An n-doped buried layer is arranged between the n-doped third SCR region 116 and the p-doped substrate 130.

The fifth SCR regions 120 and sub-regions 122 of the p-doped fourth SCR region 118 are alternately arranged along the first lateral direction x1 and directly adjoin one another.

The first SCR regions 110 are electrically connected to the first electrode 115, and the fifth SCR regions 120 are electrically connected to the second electrode 117. One or a combination of the contact schemes illustrated in FIGS. 5A to 5C may be applied to the first SCR regions 110 and the sub-regions 114 of the second SCR region 112 as well as to the fifth SCR regions 120 and the sub-regions 122 of the fourth SCR region 118.

The active device region 106 of the silicon controlled rectifier 100 is electrically insulated from neighboring active device regions 1161, 1162 by a device isolation region. The device isolation region in the embodiment illustrated in FIG. 6 is a trench isolation structure 134 extending from the first main surface 104 through the active device region 106 and through the buried layer 132 into the substrate 130. The trench isolation structure 134 includes a trench dielectric 136 lining sidewalls of the trench isolation structure 134 and a trench electrode 138 electrically insulated from the active device regions 106, 1161, 1162 by the trench dielectric 136. The trench electrode 138 allows for electrically connecting the substrate 130 to a reference potential, e.g. ground at the first main surface 104. The trench isolation structure may be a deep trench isolation (DTI), for example.

At the first main surface 104 in the active device region 106, shallow isolation regions, e.g. shallow trench isolation (STI) regions 140 are arranged in surface area parts that are not electrically connected to an electrode, for example.

Figure 7:
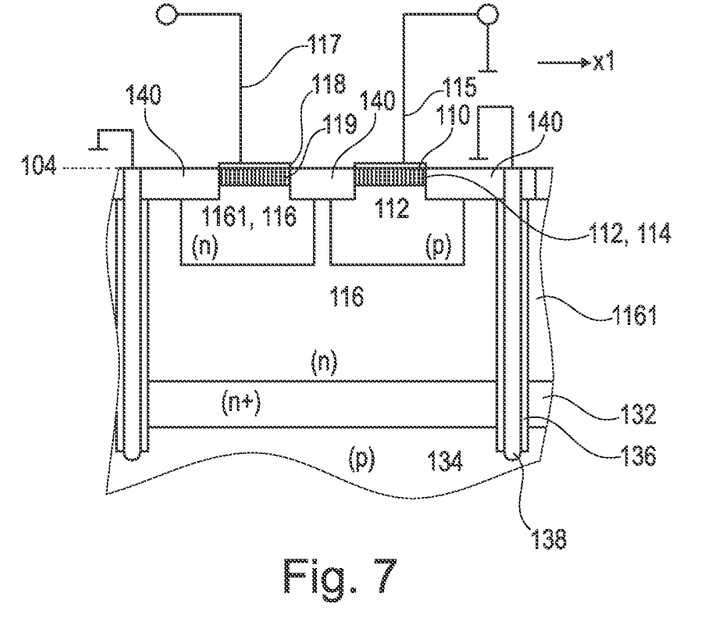

The schematic cross-sectional view of FIG. 7 illustrates an embodiment of a uni-directional silicon controlled rectifier 100.

While the silicon controlled rectifier 100 illustrated in FIG. 6 includes a npnpn sequence between the first and second electrodes 115, 117 for achieving bi-directional triggering and bi-directional conduction, the silicon controlled rectifier 100 illustrated in FIG. 7 includes a pnpn sequence between the first and second electrodes 115, 117 for achieving uni-directional triggering and bi-directional conduction (reverse conduction is achieved by reverse diode path formed by the structure of FIG. 6). Other than in the bi-directional silicon controlled rectifier 100 illustrated in FIG. 6, the n-doped third SCR region 116 of FIG. 7 directly adjoins the first main surface 104. The fourth SCR region 118 and sub-regions 119 of the third SCR region 116 are alternately arranged along the first lateral direction x1 at the first main surface 104. The n-doped third SCR region 116 may include an n-doped well region 1161 as a sub-region. Provision and dimensions of the n-doped well region 1161 may allow for adjusting SCR characteristics, e.g. triggering behavior and holding voltage.

The above contact schemes illustrated in FIGS. 5A to 5D and the doping schemes of FIGS. 4A to 4C may be combined in any way with respect to different areas of the silicon controlled rectifier 100 of FIG. 7 regardless of shape, e.g. stripes or islands, of the first SCR regions 110 or the sub-regions 114 of the second SCR region 112. By varying the impedance of the electric connection between the sub-regions 114 of the second SCR region 112 and the contact structures 126, electric characteristics of the silicon controlled rectifier 100, e.g. triggering behavior and holding voltage, may be adjusted.

The uni-directional silicon controlled rectifier 100 of FIG. 7 may be manufactured by a HV CMOS technology, for example.

Figure 8:
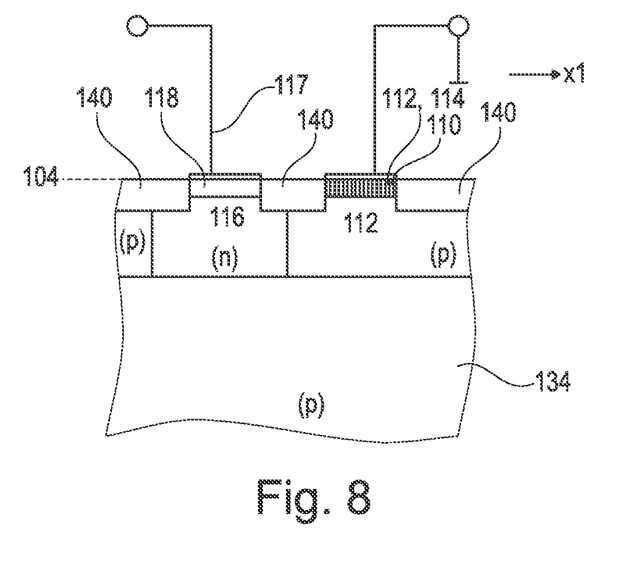

The schematic cross-sectional view of FIG. 8 illustrates another embodiment of a uni-directional silicon controlled rectifier 100.

Other than in the uni-directional silicon controlled rectifier 100 illustrated in FIG. 7, the fourth SCR region 118 and the sub-regions of the third SCR region 116 are not alternately arranged along the first lateral direction x1 at the first main surface 104. The fourth SCR region 118 is arranged between the first main surface 104 and the third SCR region 116. Thus, the third SCR region 116 is spaced apart from the first main surface 104.

The above contact schemes illustrated in FIGS. 5A to 5C may be combined in any way with respect to different areas of the silicon controlled rectifier 100 of FIG. 8 regardless of shape, e.g. stripes or islands, of the first SCR regions 110 or the sub-regions 114 of the second SCR region 112. By varying the impedance of the electric connection between the sub-regions 114 of the second SCR region 112 and the contact structures 126, electric characteristics of the silicon controlled rectifier 100, e.g. triggering behavior and holding voltage, may be adjusted.

The uni-directional silicon controlled rectifier 100 may be manufactured by a standard CMOS technology, for example.

In the silicon controlled rectifier 100 of FIG. 8, the fourth SCR region 118 may also be formed as a metal, for example. This allows for forming a Schottky junction at an interface between the third and fourth SCR regions 116, 118.

Figure 9A:
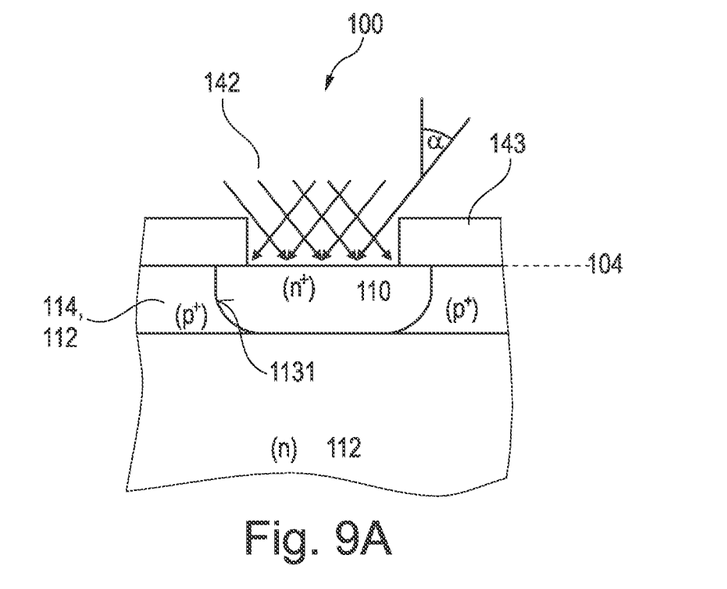
FIGS. 9A to 9B are cross-sectional views for illustrating process features configured to increase a pn-junction area between SCR regions.
Figure 9B:
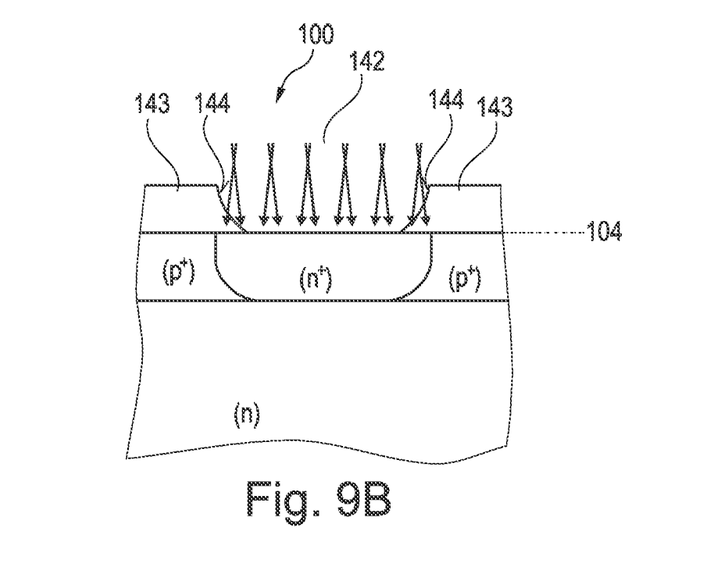

FIGS. 9A to 9B are cross-sectional views for illustrating process features configured to increase a pn-junction area between SCR regions, e.g. between the first SCR regions 110 and the sub-regions 114 of the second SCR region 112, or between the fifth SCR regions 120 and the sub-regions 122 of the fourth SCR region 118.

Referring to the schematic cross-sectional view of FIG. 9A, an area of the first pn-junction 1131 may be increased by forming the first SCR regions 110 by at least one ion implantation process at a tilt angle α in a range from 5° to 25°, or in a range from 10° to 20°.

Referring to the schematic cross-sectional view of FIG. 9B, an area of the first pn-junction 1131 may also be increased by forming the first SCR regions 110 by at least one ion implantation process through an opening 142 of an ion implantation mask, e.g. a photoresist or silicon nitride hard mask 143, wherein sidewalls 144 of the opening 143 are sloped or curved.

Tilted ion implantation and sloped or curved sidewalls of the ion implantation mask openings may be combined.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A silicon controlled rectifier (SCR), comprising:
a semiconductor body having a first main surface;
an active device region;
a device isolation region configured to electrically insulate the active device region from neighboring active device regions;
first SCR regions in the active device region;
a second SCR region of a first conductivity type in the active device region, wherein a first pn-junction or a Schottky junction is formed at an interface between the first SCR regions and the second SCR region, wherein a first plurality of the first SCR regions and sub-regions of the second SCR region are alternately arranged and directly adjoin one another;
a third SCR region of a second conductivity type in the active device region, wherein a second pn-junction is formed at an interface between the second SCR region and the third SCR region;
a fourth SCR region of the first conductivity type in the active device region, wherein a third pn-junction is formed at an interface between the third SCR region and the fourth SCR region;
a first electrode electrically connected to the first plurality of the first SCR regions at the first main surface; and
a second electrode electrically coupled to the fourth SCR region at the first main surface,
wherein the second SCR region and the fourth SCR region are embedded in the third SCR region, and wherein the silicon controlled rectifier further comprises:
fifth SCR regions in the active device region,
wherein a fourth pn-junction or a Schottky junction is formed at an interface between the fourth SCR region and the fifth SCR regions,
wherein a first plurality of the fifth SCR regions and sub-regions of the fourth SCR region are alternately arranged and directly adjoin one another, and
wherein the second electrode is electrically connected to the first plurality of the fifth SCR regions at the first main surface.

2. The silicon controlled rectifier of claim 1, wherein the first plurality of the first SCR regions and the sub-regions of the second SCR region are arranged in stripes extending along a lateral direction, and wherein the lateral direction is parallel or perpendicular to a longitudinal direction of the second SCR region.

3. The silicon controlled rectifier of claim 1, wherein the first plurality of the first SCR regions and the sub-regions of the second SCR region are arranged in a checkerboard pattern at the first main surface.

4. The silicon controlled rectifier of claim 1, wherein the first plurality of the first SCR regions and a second plurality of the first SCR regions are merged to form a continuous first SCR region, and wherein the sub-regions of the second SCR region are laterally surrounded by the continuous first SCR region.

5. The silicon controlled rectifier of claim 1, wherein the sub-regions of the second SCR region are defined by a first vertical doping profile that fully overlaps with a second vertical doping profile of the second SCR region, and wherein a maximum doping concentration of the first vertical doping profile is at least two orders of magnitude larger than a maximum doping concentration of the second vertical doping profile.

6. The silicon controlled rectifier of claim 1, wherein the second SCR region is defined by a single vertical doping profile, and wherein the sub-regions of the second SCR region are defined by a part of the single vertical doping profile.

7. The silicon controlled rectifier of claim 1, wherein an overall area of the second SCR region at the first main surface directly adjoins a dielectric.

8. The silicon controlled rectifier of claim 1, wherein an overall area of the second SCR region at the first main surface directly adjoins a metal silicide, and wherein a contact area of the first electrode is limited to an area of the first plurality of the first SCR regions at the first main surface.

9. The silicon controlled rectifier of claim 1, wherein a lateral doping concentration profile of the second conductivity type that extends, at a constant vertical level in the semiconductor body, through one the first SCR regions and through a neighboring one of the sub-regions of the second SCR region is a constant lateral doping concentration profile.

10. The silicon controlled rectifier of claim 1, wherein the second SCR region is embedded in the third SCR region, and wherein a first plurality of fourth SCR regions and sub-regions of the third SCR region are alternately arranged and directly adjoin one another.

11. The silicon controlled rectifier of claim 1, wherein the third SCR region is spaced apart from the first main surface, and wherein the fourth SCR region is arranged between the first main surface and the third SCR region.

12. A method of manufacturing a silicon controlled rectifier, (SCR), the method comprising:
providing a semiconductor body having a first main surface;
forming a device isolation region configured to electrically insulate an active device region from neighboring active device regions;
forming first SCR regions in the active device region;
forming a second SCR region of a first conductivity type in the active device region, wherein a first pn-junction or a Schottky junction is formed at an interface between the first SCR regions and the second SCR region, wherein a first plurality of the first SCR regions and sub-regions of the second SCR region are alternately arranged and directly adjoin one another;
forming a third SCR region of a second conductivity type in the active device region, wherein a second pn-junction is formed at an interface between the second SCR region and the third SCR region;
forming a fourth SCR region of the first conductivity type in the active device region, wherein a third pn-junction is formed at an interface between the third SCR region and the fourth SCR region;
forming a first electrode electrically connected to the first plurality of the first SCR regions at the first main surface;
forming a second electrode electrically coupled to the fourth SCR region at the first main surface; and
forming fifth SCR regions in the active device region,
wherein a fourth pn-junction or a Schottky junction is formed at an interface between the fourth SCR region and the fifth SCR regions,
wherein a first plurality of the fifth SCR regions and sub-regions of the fourth SCR region are alternately arranged and directly adjoin one another, and
wherein the second electrode is electrically connected to the first plurality of the fifth SCR regions at the first main surface.

13. The method of claim 12, wherein forming the first SCR regions comprises at least one ion implantation process at a tilt angle in a range from 5° to 25°.

14. The method of claim 13, wherein the tilt angle is in a range 10° to 20°.

15. The method of claim 12, wherein forming the first SCR regions comprises at least one ion implantation process through an opening of an ion implantation mask.

16. The method of claim 15, wherein sidewalls of the opening are sloped or curved.

17. The method of claim 15, wherein the ion implantation mask comprises a photoresist or is a silicon nitride hard mask.

18. The method of claim 12, wherein the second SCR region and the fourth SCR region are embedded in the third SCR region.

19. A silicon controlled rectifier (SCR), comprising:
a semiconductor body having a first main surface;
an active device region;
a device isolation region configured to electrically insulate the active device region from neighboring active device regions;
first SCR regions in the active device region;
a second SCR region of a first conductivity type in the active device region, wherein a first pn-junction or a Schottky junction is formed at an interface between the first SCR regions and the second SCR region, wherein a first plurality of the first SCR regions and sub-regions of the second SCR region are alternately arranged and directly adjoin one another;
a third SCR region of a second conductivity type in the active device region, wherein a second pn-junction is formed at an interface between the second SCR region and the third SCR region;
a fourth SCR region of the first conductivity type in the active device region, wherein a third pn-junction is formed at an interface between the third SCR region and the fourth SCR region;
a first electrode electrically connected to the first plurality of the first SCR regions at the first main surface; and
a second electrode electrically coupled to the fourth SCR region at the first main surface, and
wherein the sub-regions of the second SCR region are defined by a first vertical doping profile that fully overlaps with a second vertical doping profile of the second SCR region, and wherein a maximum doping concentration of the first vertical doping profile is at least two orders of magnitude larger than a maximum doping concentration of the second vertical doping profile.

* * * * *

UNITED STATES PATENT AND TRADEMARK OFFICE
CERTIFICATE OF CORRECTION

Page 1 of 1

PATENT NO. : 11,121,126 B2
APPLICATION NO. : 16/775552
DATED : September 14, 2021
INVENTOR(S) : Russ et al.

It is certified that error appears in the above-identified patent and that said Letters Patent is hereby corrected as shown below:

On the Title Page

Other Publications, Column 2, Line 1, please change "Dendron" to -- Gendron --

Signed and Sealed this
Seventh Day of December, 2021

Drew Hirshfeld
*Performing the Functions and Duties of the
Under Secretary of Commerce for Intellectual Property and
Director of the United States Patent and Trademark Office*